US005465192A

United States Patent [19]

Yoshikawa

[11] Patent Number: 5,465,192
[45] Date of Patent: Nov. 7, 1995

[54] COOLING APPARATUS FOR INTEGRATED CIRCUIT CHIPS FOR PREVENTING FORCIBLE CONTACT BETWEEN A COOLING MEMBER AND THE CHIPS

[75] Inventor: Minoru Yoshikawa, Tokyo, Japan

[73] Assignee: NEC Corporation, Tokyo, Japan

[21] Appl. No.: 263,377

[22] Filed: Jun. 21, 1994

[30] Foreign Application Priority Data

Jun. 21, 1993 [JP] Japan ................................. 5-148740

[51] Int. Cl.$^6$ .................................................. H05K 7/20
[52] U.S. Cl. .......................... 361/705; 62/383; 165/80.4; 361/699; 361/719
[58] Field of Search .............................. 62/259.2, 383; 165/80.4, 104.33, 185; 174/15.1; 257/712–714, 720, 723, 724; 361/689, 699, 704, 705, 717–719

[56] References Cited

U.S. PATENT DOCUMENTS

| | | | |
|---|---|---|---|
| 4,644,385 | 2/1987 | Nakanishi et al. | 357/82 |
| 4,791,983 | 12/1988 | Nicol | 165/80.4 |
| 4,977,444 | 12/1990 | Nakajima | 357/82 |
| 5,023,695 | 6/1991 | Umezawa et al. | 357/82 |
| 5,050,036 | 9/1991 | Oudick | 361/719 |
| 5,166,863 | 11/1992 | Shmunis | 361/699 |
| 5,264,984 | 11/1993 | Akamatsu | 361/689 |
| 5,390,076 | 2/1995 | Umezawa | 361/689 |

FOREIGN PATENT DOCUMENTS

917371-A 3/1982 U.S.S.R. ........................... 361/699

*Primary Examiner*—Gerald P. Tolin
*Attorney, Agent, or Firm*—Sughrue, Mion, Zinn, Macpeak & Seas

[57] ABSTRACT

A cooling apparatus for integrated circuit chips in which the pressure of coolant does not affect the pressure exerted by the cooling apparatus on the chip. A block is provided with a plurality of holes, and cooling members are inserted in these holes. An elastic member is provided between the block and the cooling member, and the cooling member is supported in the block by the elastic member. Each of the cooling members are connected by pipes, and a bellows is provided in the pipe. When the block is loaded on the substrate on which the integrated circuit chips are mounted, the elastic member deforms and the cooling member is displaced in accordance with the height and inclination of the integrated circuit chip. The lower surface of the cooling member is brought into close contact with the integrated circuit chip due to the deformation of the elastic member. The bellows deforms in accordance with the displacement of the cooling member to ensure the normal connection of the pipe. When the coolant is supplied through a nozzle into the cooling member, the expanded bellows pushes the pipe up but does not push the cooling member down since the nozzle is fixedly secured in the cooling member.

9 Claims, 5 Drawing Sheets

COOLING APPARATUS FOR INTEGRATED CIRCUIT CHIPS FOR PREVENTING FORCIBLE CONTACT BETWEEN A COOLING MEMBER AND THE CHIPS

BACKGROUND OF THE INVENTION

1. Field of the Invention

The present invention relates to a liquid cooling apparatus for integrated circuit chips, more particularly, to a cooling apparatus in which integrated circuit chips are cooled with cooling members in contact with the chips.

2. Description of the Related Art

An example of a cooling apparatus incorporating cooling members is disclosed in U.S. Pat. No. 5,023,695. In the structure shown in FIG. 3 of this patent, a cooling module 4 corresponds to the cooling member. The cooling module 4 is provided with a cavity 13. Cooling fluid is injected into the cavity 13.

In such cooling apparatus, the cooling member has to be in close contact with the integrated circuit chip. A gap between the cooling member and the integrated circuit chip decreases the cooling efficiency of the apparatus.

One of the factors preventing the contact of the cooling member and the integrated circuit chip is a difference in height between the integrated circuit chips. If an integrated circuit chip is low in height, the gap between the cooling member and the integrated circuit chip is wide. Another factor preventing the contact of the cooling member and the integrated circuit chip is inclination of the integrated circuit chip. If an integrated circuit chip is inclined, the cooling member contacts only partially with the integrated circuit chip. These factors can be eliminated by precisely adjusting the height and inclination of the cooling member.

However, when a plurality of integrated circuit chips are cooled, it is difficult to make the cooling members in close contact with the corresponding integrated circuit chips because the height and inclination of each integrated circuit chip is different. In the structure disclosed in U.S. Pat. No. 5,023,695, the cooling module 4 is composed of one member. For this reason, the cooling module 4 can not be adjusted to the height and inclination of each integrated circuit chip.

A cooling apparatus capable of solving such a problem is disclosed in U.S. Pat. No. 4,644,385. In the structure shown in FIG. 1 of the patent, the cooling member 1 is arranged independently to each of chips 2. The cooling members 1 are connected each other with pipes. In this structure, each cooling member 1 is closely contacted with the corresponding chip 2 regardless of the height and inclination of chip 2. Because the cooling members 1 are connected to each other through the bellows 12, the position and inclination of them can be changed freely. As a result, each of the cooling members 1 is brought in close contact with the corresponding chip 2.

As described in the second column, lines 56 to 60 of the patent, the bellows expands vertically due to the pressure of the coolant, so that the bellows applies pressure to the integrated circuit chip 2. If the supply of the coolant is increased, the pressure is also increased. High pressure of the coolant may destroy the integrated circuit chips 2 or joint portions between the integrated circuit chip 2 and circuit board 3. Therefore, the coolant cannot be adequately supplied in this structure.

SUMMARY OF THE INVENTION

A general object of the present invention is to provide a cooling apparatus for integrated circuits in which a fault of the integrated circuit chip is not caused.

Another object of the present invention is to provide a cooling apparatus for effectively cooling a plurality of integrated circuit chips.

A more specific object of the present invention is to provide a cooling structure in which cooling members can be brought into close contact with a plurality of integrated circuit chips.

Another object of the present invention is to provide a cooling apparatus in which a plurality of cooling members can be installed to the integrated circuit chips at the same time.

Still another object of the present invention is to provide a cooling apparatus in which a plurality of cooling members can be detached at the same time.

Yet another object of the present invention is to provide a cooling apparatus which can seal the integrated circuit.

In one preferred embodiment of the present invention, cooling members are inserted in a hole of a plate. The lower portions of the cooling members protrude from the lower surface of the plate. The gap between the cooling members and the plate is filled with elastic members. Elastic support allows the cooling members to be movable to some extent.

When the plate is arranged over integrated circuit chips, the lower surface of each cooling member contacts the corresponding integrated circuit. Due to elastic support, the cooling members move and incline according to the height and the inclination of the integrated circuit chip. Displacement of the cooling members allows them to be in close contact with the corresponding integrated circuit chips.

In another preferred embodiment, a pipe connecting the cooling members is provided at an upper portion of the plate. A part of the pipe is elastic or flexible. More specifically, a part of the pipe is a bellows or hose.

In still another preferred embodiment, in the integrated circuit cooling apparatus of the present invention, the integrated circuit chips are sealed in the space between the substrate and a block for supporting the cooling members.

BRIEF DESCRIPTION OF THE DRAWINGS

Other objects, features and advantages of the present invention will become more apparent when the following description is read in conjunction with the accompanying drawings, wherein.

In the drawings, identical reference numerals indicate similar components.

DESCRIPTION OF THE PREFERRED EMBODIMENT

Figure 1:
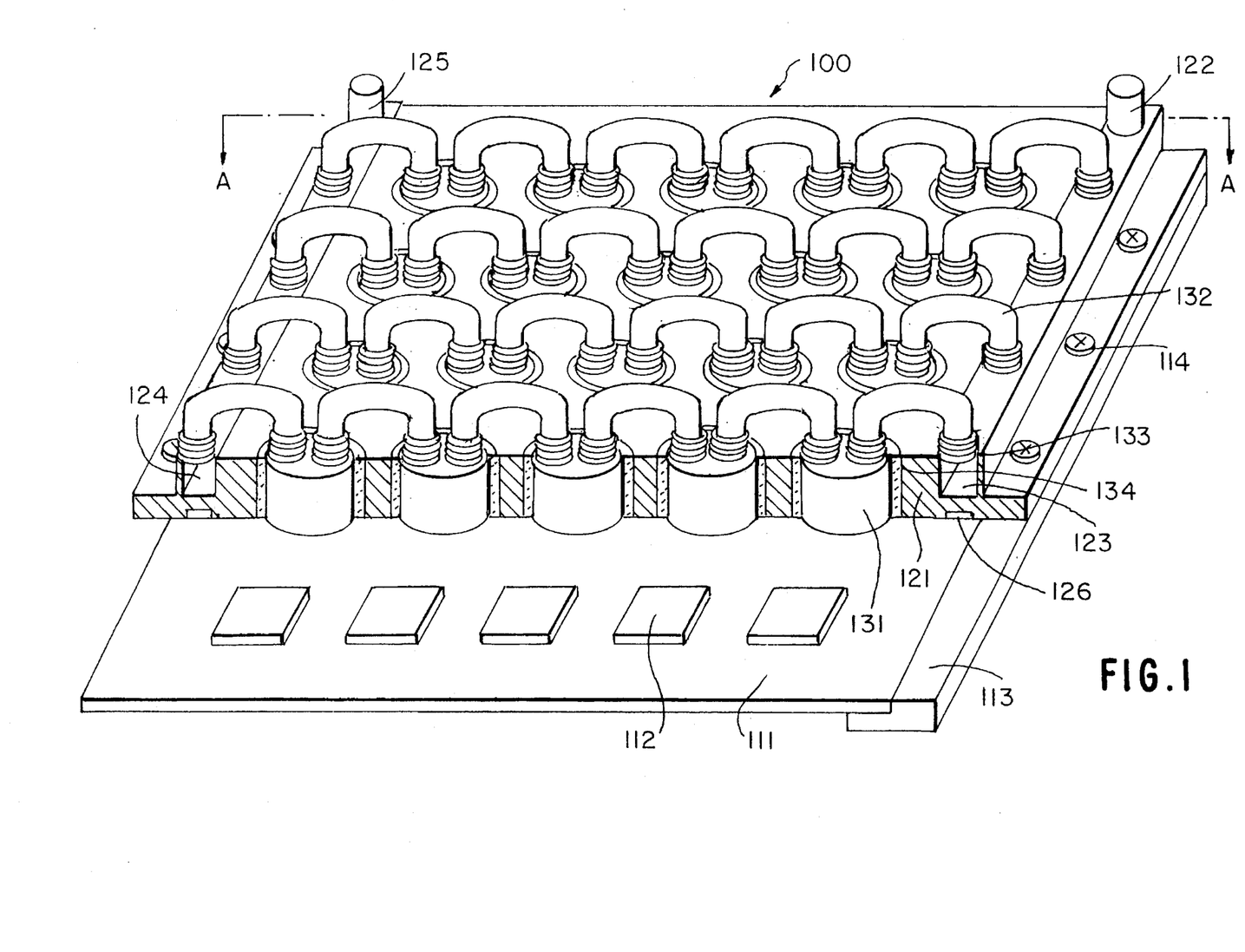
FIG. 1 is a perspective view of the first embodiment of the present invention.

Referring to FIG. 1, in the first embodiment of the present invention, integrated circuit chips 112 are mounted on a substrate 111 in a face down state. A cooling module 100 is arranged on the integrated circuit chips 112.

The cooling module 100 includes a block 121 having a plurality of holes. A cooling member 131 is inserted in the corresponding hole of the block 121. The holes are arranged in matrix. The positions of the holes are matched with those of the integrated circuit chips 112. The cooling members 131 in a row are connected in series by metal pipes 132. The starting end of pipe 132 of each row is connected to the coolant passage 123 of the block 121. The other end of pipe 132 is connected to the coolant passage 124 in the block 121.

An elastic member 134 is filled in the gap between the block 121 and the cooling member 131. The cooling member 131 is supported in the block 121 by the elastic member 134. Due to the elasticity of the elastic member 134, the cooling member 131 is movable elastically. Namely, the elastic member 134 can change the position and the inclination to some extent. For instance, a soft elastic material such as rubber and silicone gel is preferable as the elastic member 134. The elasticity of the elastic member 134 can be adjusted by changing the material and size of the elastic member 134. The material and size of the elastic member 134 should be selected so that the elastic member 134 has the minimum elasticity necessary to press a compound 211, which will be described later, sufficiently thin. When the elastic member 134 is selected, the durability and hermetic property should be considered in addition to the above-mentioned elasticity. Experiments have proven that the silicone gel is desirable for the elastic member 134.

By employing the elastic member 134 having a hermetic property, the integrated circuit chips 112 can be sealed. If the integrated circuit chip 112 is a bare chip, the sealing of the integrated circuit chip 112 is effective to prevent its fault. The integrated circuit chip 112 is sealed in the space surrounded by the cooling module 100 and the substrate 111. In order to ensure the sealing, an O-ring 126 is provided between the block 121 and the substrate 111. The O-ring 126 increases the hermetic property in the periphery of the block 121. When the integrated circuit chip 112 is sealed, a substance with no pinholes must be used as the elastic member 134. The space surrounded by the cooling module 100 and substrate 111 is filled with a gas such as nitrogen gas, rare gas or the like. These gases make an inactive environment in the space. By sealing the block 121, the surface of the substrate 111 can be shielded from the outer humidity. Because the bad influence caused by humidity can be avoided, the normal operation of the integrated circuit chip 112 can be ensured, and in addition, the man-hours for sealing the individual integrated circuit chip 112 are also unnecessary.

Figure 2:
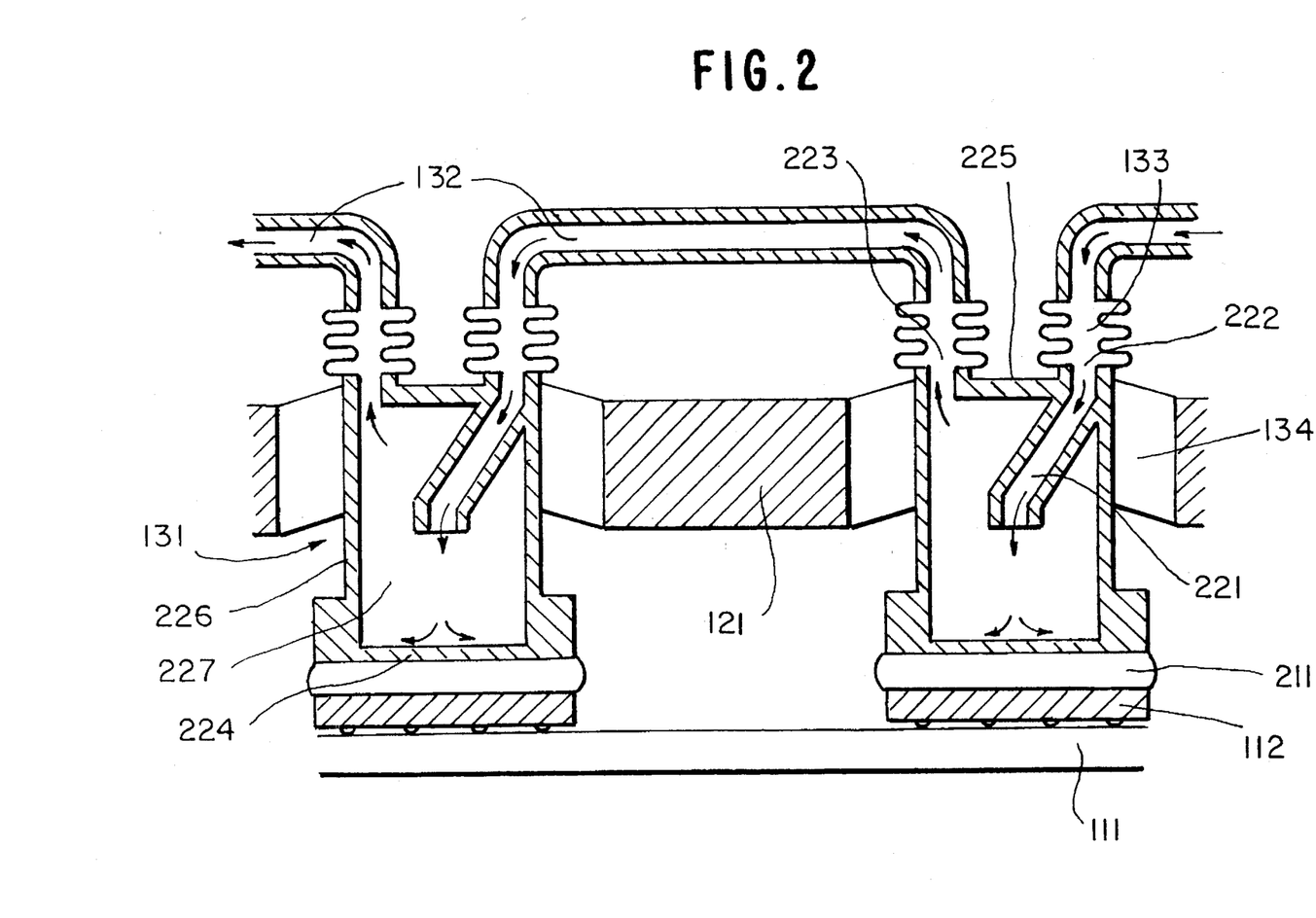
FIG. 2 is a cross sectional view taken along the A—A line of FIG. 1.

Referring to FIG. 2, the cooling member 131 has a cavity 227. The cooling member 131 is constituted of a cylindrical member 226 and flat plates 224 and 225. The flat plates 224 and 225 close the upper and lower opening portions of the cylindrical member 226. The cooling member 131 is made of a material having a high thermal conductivity. For instance, a metallic member such as copper is desirable.

The flat plate 225 is provided with two opening portions, i.e., a inflow port 222 and a outflow port 223. The pipe 132 is attached to the upper portion of the inflow port 222 via a bellows 133 and another pipe 132 is also attached to the upper portion of the outflow port via another bellows 133.

The bellows 133 is flexible, expanding and shrinking free. The pipe 132 and bellows 133 are provided at the upper portion of block 121. The pipe 132 and the bellows 133 are connected each other with a normal welding technique. The pipe 132 connects the adjacent cooling members 131 one after another. A nozzle 221 is attached at the lower portion of the inflow port 222 and protrudes downwards towards the flat plate 224.

The lower portion of the cylindrical member 131 and the flat plate 225 protrude downwards from the lower surface of the block 121.

Compound 211 in a paste state is inserted in a gap between the cooling member 131 and the integrated circuit chip 112. The compound 211 preferably has a high thermal conductivity. For instance, silicone oil in which high thermal conductive fillers such as metal oxide are mixed is desirable.

The operation of the embodiment will be described. First, the procedure for arranging the cooling module 100 will be described.

Figure 3A:
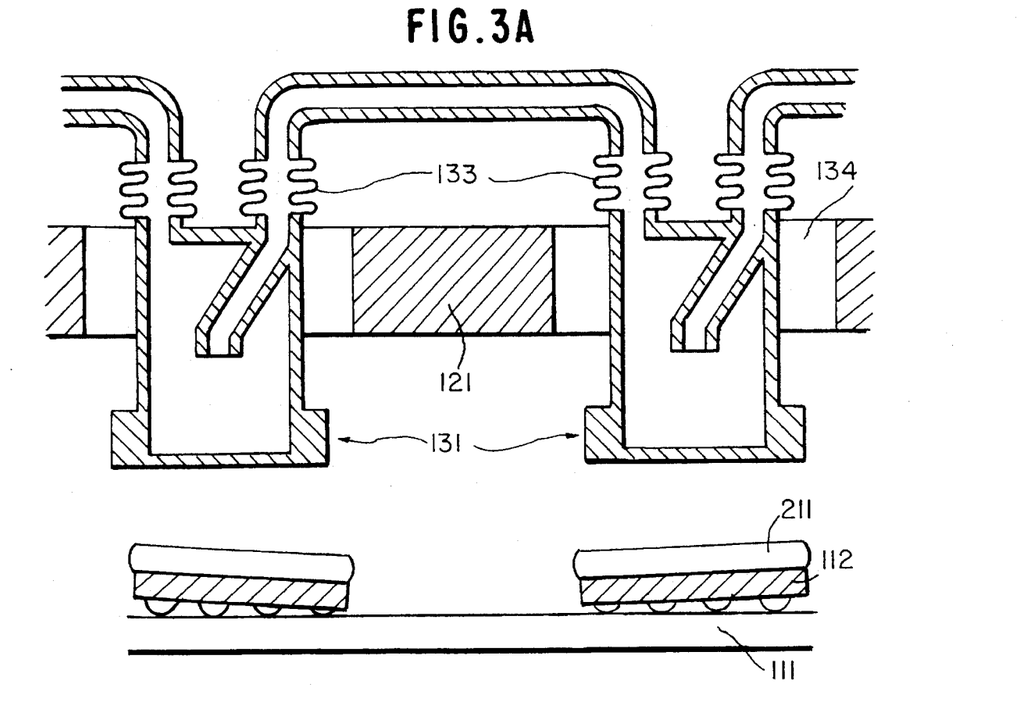
FIGS. 3A and 3B are cross sectional views showing procedures for arranging a cooling module 100 and the configuration of the cooling member 131 and an elastic member 134 after the cooling module 100 is mounted.

Referring to FIGS. 1 and 3A, the cooling members 131 are all attached to the cooling module 100. In order to set up the cooling module 100, the position of the cooling module 100 is adjusted so that each cooling member 131 is positioned on the corresponding integrated circuit chip 112.

Figure 3B:
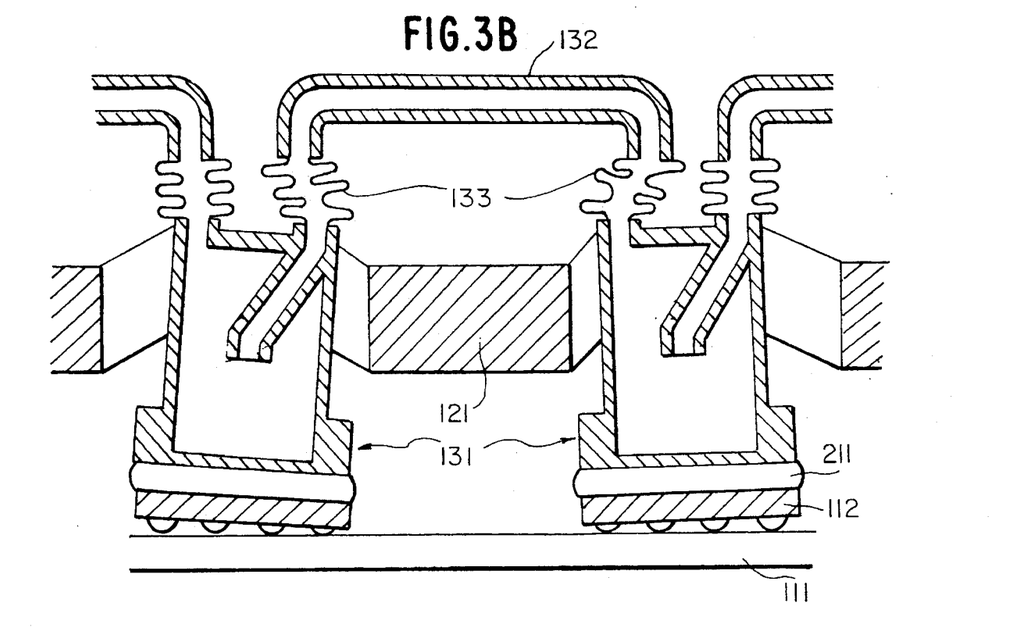

Referring to FIGS. 1 and 3B, the cooling module 100 is pressed against the substrate 111 and screwed to a flange 113. All the cooling modules 131 can be installed at the same time.

When the cooling module 100 is pressed, the elastic member 134 for supporting the cooling member 131 is deformed. The height and inclination of the cooling member 131 can be changed in correspondence with those of the integrated circuit chip 112 because of the deformation of the elastic member 134. The flat plate 224 of each cooling member 131 becomes parallel to the upper surface of the corresponding integrated circuit chip 112. As a result, the flat panel 224 of the cooling member 131 is brought into close contact with the corresponding integrated circuit chip 112. The close adhesion between the cooling member 131 and the integrated circuit chip 112 is further improved with the compound 211.

Because the height and inclination of the cooling member 131 are individually changed, the distance between adjacent cooling members 131 unexpectedly changes. In FIG. 3B, the distance between the inflow port 222 of a cooling member 131 and an outflow port 223 of the other cooling member 131 is shortened because of the inclination of the integrated circuit chips 112. The length of the pipe 132 must be adjusted in accordance with the distance between the cooling members 131. In this embodiment, this adjustment is made automatically because of the deformation of the bellows 133.

Next, the circulation of the coolant in the operation state of the embodiment will be described.

After the cooling module 100 is arranged, the coolant is supplied from the outside. In this embodiment, various types of fluid coolant such as water and liquid nitrogen are available.

Referring to FIG. 1, the coolant flows into the coolant path 123 from the inlet 122 and is supplied to each cooling member 131 via the pipes 132.

Referring to FIG. 2, the coolant flowed into the cooling member 131 from the inflow port 222 is sprayed toward the flat panel 224 from a nozzle 221. The heat generated from the integrated circuit chip 112 is transferred to the flat plate 224 through the compound 211. The heat transferred to the flat plate 224 is taken out rapidly by the coolant which collides with the flat plate 224. After absorbing the heat of the flat panel 224, the coolant flows into the pipe 132 via the outflow port 223 and flows through the pipe 132 towards the next cooling member 131. The coolant which passes through all the cooling members 131 connected in series flows into the coolant passage 124 and is discharged from the outlet 125.

When the coolant is supplied, the bellows 133 expands by the pressure of the coolant. The expanded bellows 133 pushes the pipe 132 up. The pressure of the bellows 133 never pushes the cooling member 131 down since the nozzle 221 is fixedly secured in the cooling member 131. For this reason, the pressure of the coolant does not affect the integrated circuit chip 112.

Next, modifications of the present embodiment will be described. Firstly, there is no limitation concerning the shape and structure of the cooling member 131. Secondly, the cooling members 131 may be arranged in a disposition other than a matrix. Thirdly, all cooling members 131 in the matrix may be connected in series with the pipe 132.

Next, the present embodiment has the following advantages.

Firstly, the pressure of the coolant does not attack the integrated circuit chip. As a result, any fault is not caused at the integrated circuit chips and the connection portions between the integrated circuit chips and the substrate.

Secondary, a plurality of cooling members can be attached to the integrated circuit chips at the same time.

Thirdly, the height and inclination of the cooling member can be adjusted in accordance with those of the corresponding integrated circuit chips. As a result, all the cooling members can be bought into close contact with the integrated circuit chips.

Fourthly, the integrated circuit chip can be sealed by using a hermetic elastic member.

Next, the second embodiment of the present invention will be described with referring to FIG. 4.

Figure 4:
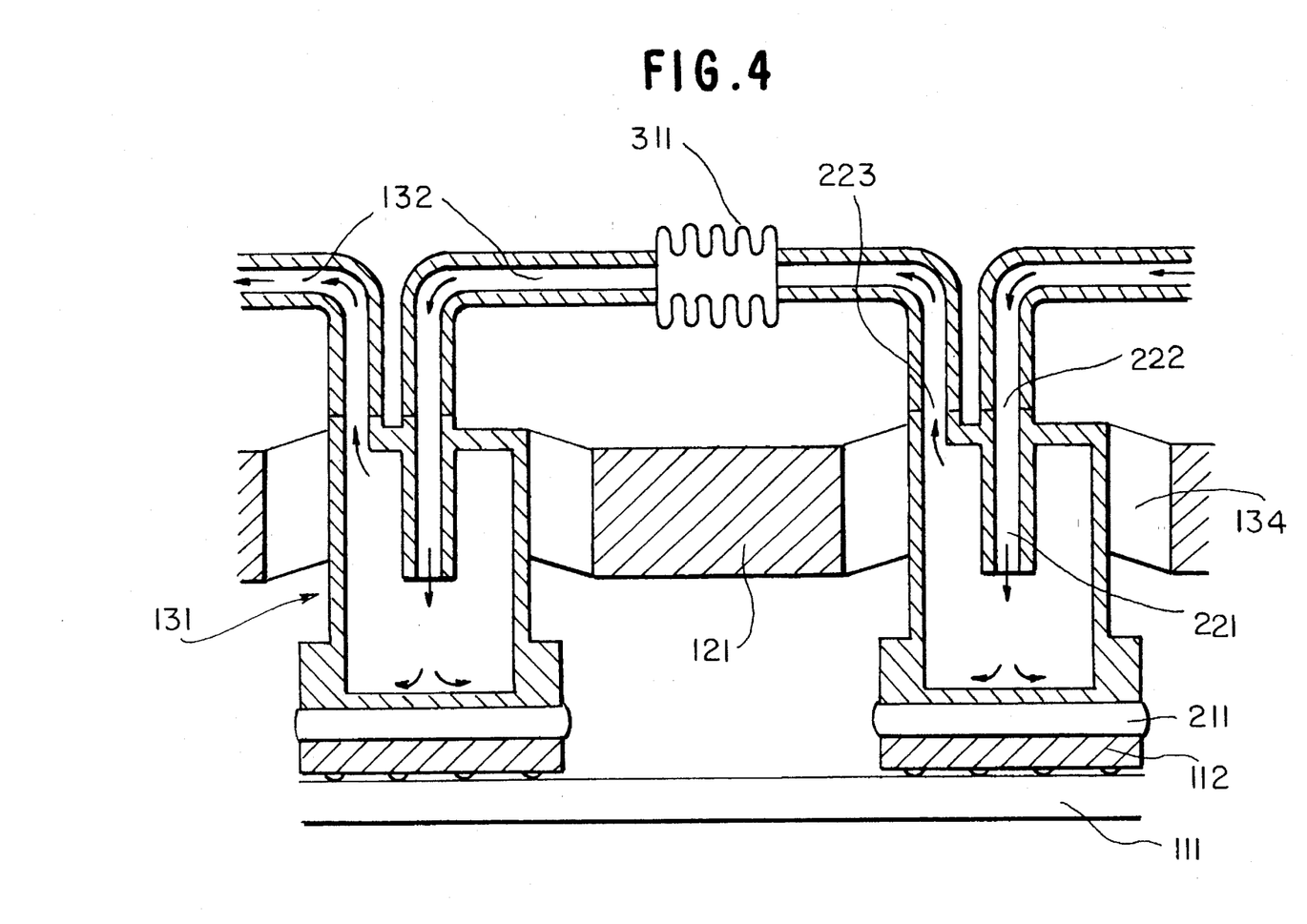
FIG. 4 illustrates the second embodiment of the present invention.

Referring to FIG. 4, the distinguishing feature of the second embodiment is the position of the bellows. Specifically, the bellows 311 is provided in the middle portion of the pipe 132 in this embodiment. The bellows 133 in the first embodiment is removed. Other than the bellows 133 and 311, the structure and the operation of the apparatus are the same as those in the first embodiment.

The pipe 132 in the present embodiment is directly connected to the inflow port 222 and the outflow port 223. Alternatively, the pipe 132 may be divided into two portions connected to each other via the bellows 311.

In this embodiment, because the bellows 311 deforms in accordance with the displacement of the cooling member 131, it is not necessary to adjust the pipe 132 after attaching the cooling modules 100.

The present embodiment has the advantage that the number of bellows to be used is sufficient if only a half of those in the first embodiment.

Next, the third embodiment of the present invention will be described referring to FIG. 5.

Figure 5:
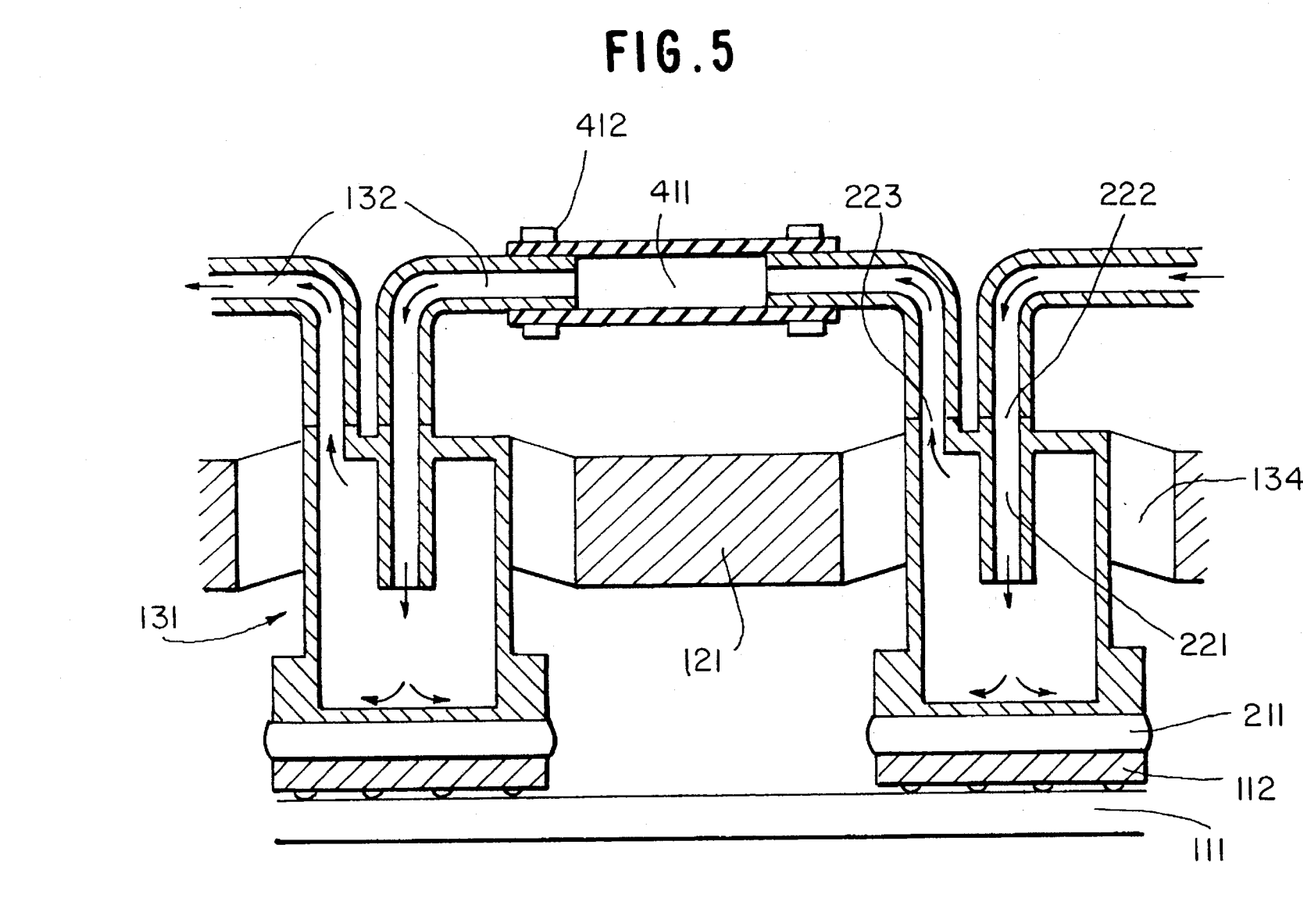
FIG. 5 illustrates the third embodiment of the present invention.

Referring to FIG. 5, the distinguishing feature of the third embodiment is the replacement of the bellows with a hose. Specifically, in this embodiment, the bellows 311 of the second embodiment is replaced with a soft hose 411. Other than hose 411, the than structure and the operation of the apparatus are the same as those in the second embodiment.

The pipe 132 of this embodiment is divided into two portions and they are connected to each other by the soft hose 411. The hose 411 is bound and fixed to the pipe 132 with a band 412. Alternatively, the hose 411 may be adhered to the pipe 132.

In this embodiment, because the bellows 311 deforms in accordance with the displacement of the cooling member 131, it is not necessary to adjust the pipe after attaching the cooling module 100.

Since the hose is easier to manufacture than the bellows, the present embodiment has the advantage that the apparatus can be manufactured more easily than in the second embodiment.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds are therefore intended to be embraced by the claims.

What is claimed is:

1. A cooling apparatus for integrated circuit chips, comprising:

a block having a hole;

a hollow cooling member for cooling an integrated circuit chip, said cooling member being inserted in the hole of said block, a lower portion of said cooling member protruding from a lower surface of said block, the lower portion of said cooling member being thermally in contact with the integrated circuit chip;

an elastic member provided between said cooling member and said block for supporting said cooling member in said block; and a nozzle for spraying a coolant inside said cooling member, said nozzle being fixedly secured in said cooling member so that the coolant sprayed from said nozzle does not cause the lower portion of said cooling member to be forcibly contacted with the circuit chip.

2. A cooling apparatus for integrated circuit chips, comprising:

a block having a plurality of holes corresponding to a plurality of integrated circuit chips;

a plurality of hollow cooling members, each of said cooling members being inserted in a respective one of the holes of said block, a lower portion of each of said cooling members protruding from a lower surface of said block and being thermally in contact with each of the plurality of integrated circuit chips;

a plurality of elastic members, each of said elastic members being provided between a respective one of said cooling members and said block for supporting said cooling members in said block;

a plurality of nozzles for spraying a coolant inside said cooling members, said nozzles being fixedly secured in said cooling members so that the coolant sprayed from said nozzles does not cause the lower portion of each of said cooling members to be forcibly contacted with the circuit chips.

3. A cooling apparatus for integrated circuit chips as claimed in claim 2, further comprising:

a plurality of first pipes for supplying the coolant to said cooling members, each of said first pipes being attached to a respective one of said cooling members and protruding from an upper surface of said block; and a plurality of second pipes for discharging the coolant from said cooling members, each of said second pipes being attached to a respective one of said cooling members and protruding from the upper surface of said block.

4. A cooling apparatus for integrated circuit chips as claimed in claim 3, wherein:

a portion of at least one of said first and second pipes is flexible.

5. A cooling apparatus for integrated circuit chips as claimed in claim 3, wherein:

a portion of at least one of said first and second pipes is a bellows.

6. A cooling apparatus for integrated circuit chips as claimed in claim 3, wherein:

a portion of at least one of said first and second pipes is a flexible hose.

7. A cooling apparatus for integrated circuit chips as claimed in claim 3, wherein:

said cooling members are fluidly connected to each other by said first pipes and said second pipes.

8. A cooling apparatus for integrated circuit chips as claimed in claim 3, wherein each of said cooling members comprises:

a cylindrical member;

a first plate closing a lower opening portion of said cylindrical member;

a second plate closing an upper opening portion of said cylindrical member;

a first hole provided in said second plate, one of said first pipes being attached to said first hole; and a second hole provided in said second plate, one of said second pipes being attached to said second hole, wherein the nozzle is attached to said first hole for spraying the coolant supplied through said first hole toward said first plate.

9. A cooling apparatus for integrated circuit chips as claimed in claim 2, further comprising:

a substrate for mounting the integrated circuit chips, and wherein:

each of said elastic members comprises a hermetic material, and said integrated circuit chips are sealed in a space defined between said block and said substrate.

* * * * *

UNITED STATES PATENT AND TRADEMARK OFFICE
CERTIFICATE OF CORRECTION

PATENT NO.   : 5,465,192
DATED        : November 7, 1995
INVENTOR(S)  : Minoru YOSHIKAWA It is certified that error(s) appears in the above-identified patent and that said Letters Patent is hereby corrected as shown below:

Col. 6, line 32, delete "elastic", insert --uncoiled elastic--.

Col. 6, line 37, delete "in" insert --to--.

Col. 6, line 38, after "member", insert --at the top of the cooling member--.

Col. 6, line 51, delete "of elastic", insert --of uncoiled elastic--.

Col. 6, line 57, delete "in", insert --to--.

Col. 6, line 58, after "members", insert --at the top of the cooling members--.

Signed and Sealed this

Twentieth Day of August, 1996

*Attest:*

BRUCE LEHMAN

*Attesting Officer*  Commissioner of Patents and Trademarks